(12) United States Patent
Kim (10) Patent No.: US 7,229,904 B2
(45) Date of Patent: Jun. 12, 2007

(54) METHOD FOR FORMING LANDING PLUG CONTACTS IN SEMICONDUCTOR DEVICE

(75) Inventor: Hyung-Hwan Kim, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/876,590

(22) Filed: Jun. 28, 2004

(65) Prior Publication Data

US 2005/0142824 A1    Jun. 30, 2005

(30) Foreign Application Priority Data

Dec. 29, 2003    (KR) ............... 10-2003-0098536

(51) Int. Cl.
- H01L 21/3205    (2006.01)
- H01L 21/4763    (2006.01)
- H01L 21/20    (2006.01)
- H01L 21/336    (2006.01)
- H01L 21/8242    (2006.01)

(52) U.S. Cl. ............... 438/586; 438/256; 438/279; 438/399

(58) Field of Classification Search ............... 438/256, 438/399, 279, 257, 275
See application file for complete search history.

(56) References Cited

U.S. PATENT DOCUMENTS

| | | | | |
|---|---|---|---|---|
| 5,977,583 A | * | 11/1999 | Hosotani et al. | 257/311 |
| 6,130,449 A | * | 10/2000 | Matsuoka et al. | 257/296 |
| 6,204,161 B1 | * | 3/2001 | Chung et al. | 438/612 |
| 6,435,942 B1 | * | 8/2002 | Jin et al. | 451/8 |
| 6,514,821 B1 | * | 2/2003 | Huang | 438/257 |

FOREIGN PATENT DOCUMENTS

| | | |
|---|---|---|
| KR | 2000-08402 | 2/2000 |
| KR | 2001-05107 | 1/2001 |
| KR | 2001-38793 | 5/2001 |

OTHER PUBLICATIONS

Notice of Preliminary Rejection from the Korean Patent Office, mailed Aug. 25, 2005, in Patent Application No. 2003-98536, and English translation thereof.

* cited by examiner

*Primary Examiner*—Chuong Anh Luu
(74) *Attorney, Agent, or Firm*—Finnegan, Henderson, Farabow, Garrett, & Dunner, L.L.P.

(57) ABSTRACT

Disclosed is a method for forming landing plug contacts in a semiconductor device. The method includes the steps of: forming a plurality of gate structures on a substrate, each gate structure including a gate hard mask; forming an inter-layer insulation layer on the gate structures; planarizing the inter-layer insulation layer through a chemical mechanical polishing (CMP) process until the gate hard mask is exposed; forming a hard mask material on the planarized inter-layer insulation layer; patterning the hard mask material, thereby forming a hard mask; forming a plurality of contact holes exposing the substrate disposed between the gate structures by etching the planarized inter-layer insulation layer with use of the hard mask as an etch mask; forming a polysilicon layer on the contact holes; and forming the landing plug contacts buried into the contact holes through a planarization process performed to the polysilicon layer until the gate hard mask is exposed.

12 Claims, 10 Drawing Sheets

METHOD FOR FORMING LANDING PLUG CONTACTS IN SEMICONDUCTOR DEVICE

FIELD OF THE INVENTION

The present invention relates to a method for fabricating a semiconductor device; and, more particularly, to a method for forming landing plug contacts in a semiconductor device.

DESCRIPTION OF RELATED ARTS

Generally, a bit line and a capacitor are electrically operated with each other through a contact connected to a source/drain junction of a transistor. Recently, an increase in scale of integration of a semiconductor device has led to a narrower spacing distance between conductive structures such as gate electrodes and thus to a decreased margin for a contact process. In order to secure a required margin for the contact process, a self-aligned contact (SAC) process is adopted.

FIGS. 1A to 1D are cross-sectional views illustrating a conventional method for forming landing plug contacts (LPCs) in a semiconductor device.

Figure 1A:
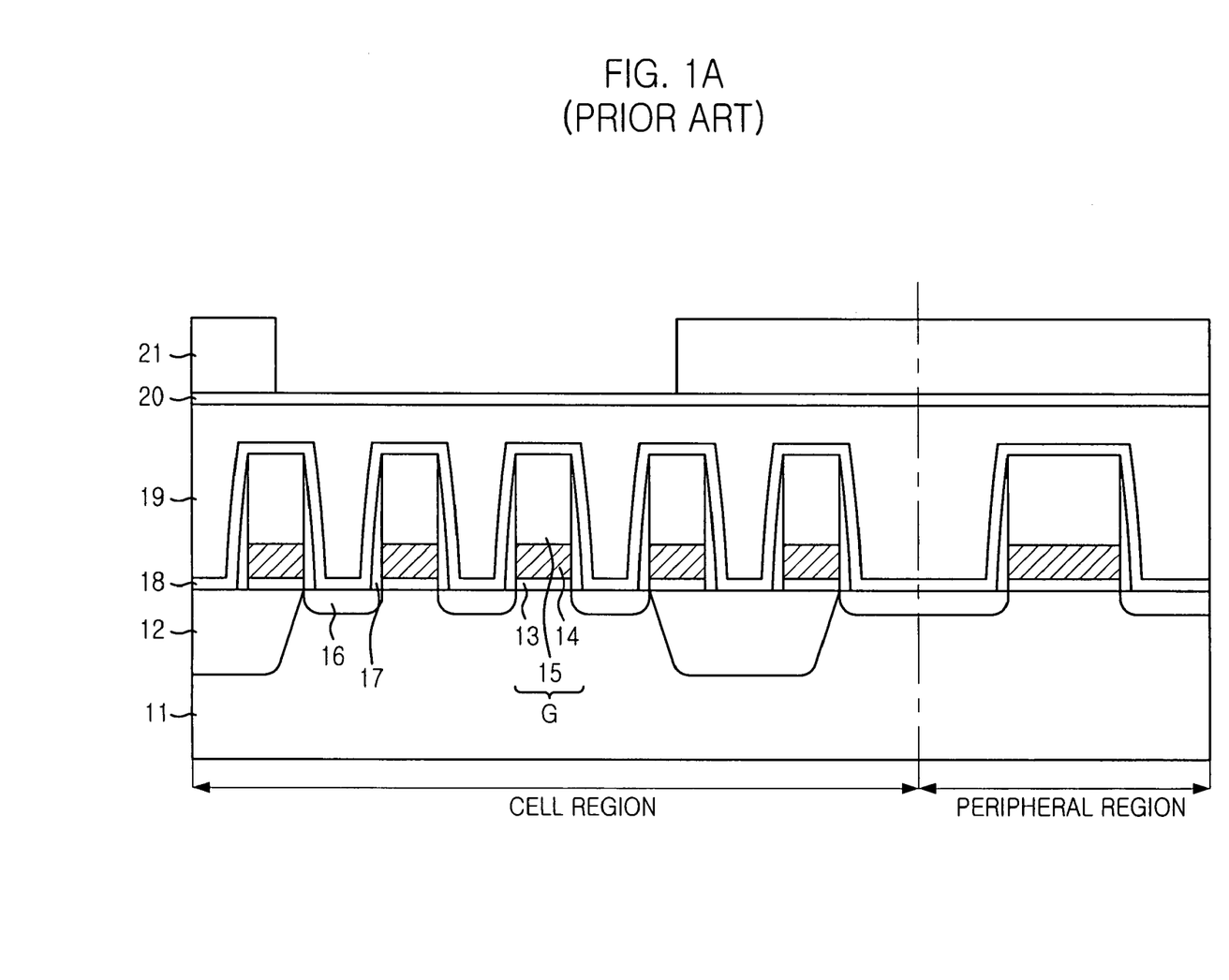
FIG. 1A is a cross-sectional view showing a conventional substrate structure including a plurality of gate structures, a nitride layer and a mask.

Referring to FIG. 1A, a field oxide layer 12 for isolating device elements is formed in a substrate 11, and then, a plurality of gate structures G are formed on the substrate 11. Herein, each gate structure G includes a gate oxide layer 13, a gate electrode 14 and a gate hard mask 15 made of nitride.

Next, an ion implantation process is performed to predetermined portions of the substrate 11 disposed between the gate structures G to form a plurality of sources/drains 16. Thereafter, a gate spacer 17 is formed on each sidewall of the gate structures G.

After the formation of the gate spacer 17, an etch stop layer 18 made of nitride is formed on the gate structures G. An inter-layer insulation layer 19 is formed on the above resulting substrate structure until gaps formed between the gate structures G are filled with the inter-layer insulation layer 19. Herein, the etch stop layer 18 plays a role in stopping an etching process for forming LPCs.

Then, a first chemical mechanical polishing (CMP) process is performed until the inter-layer insulation layer 19 remains with a predetermined thickness. After the first CMP process, the inter-layer insulation layer 19 is planarized. The reason for precedently performing the first CMP process to the inter-layer insulation layer 19 is to secure a margin for forming a mask for use in a LPC formation process and to use the planarized inter-layer insulation layer 19 for a subsequent SAC etching process.

Subsequent to the first CMP process, a nitride layer 20 for forming a hard mask is formed on the planarized inter-layer insulation layer 19 in order to easily pattern target layers for forming the LPCs. Then, a photosensitive layer is formed on the nitride layer 20 and is patterned through a photo-exposure and developing process, so that a mask 21 for use in an etching process for forming the LPCs is formed. At this time, the mask 21 is a line-type contact mask formed in the shape of 'T' or 'I'.

Figure 1B:
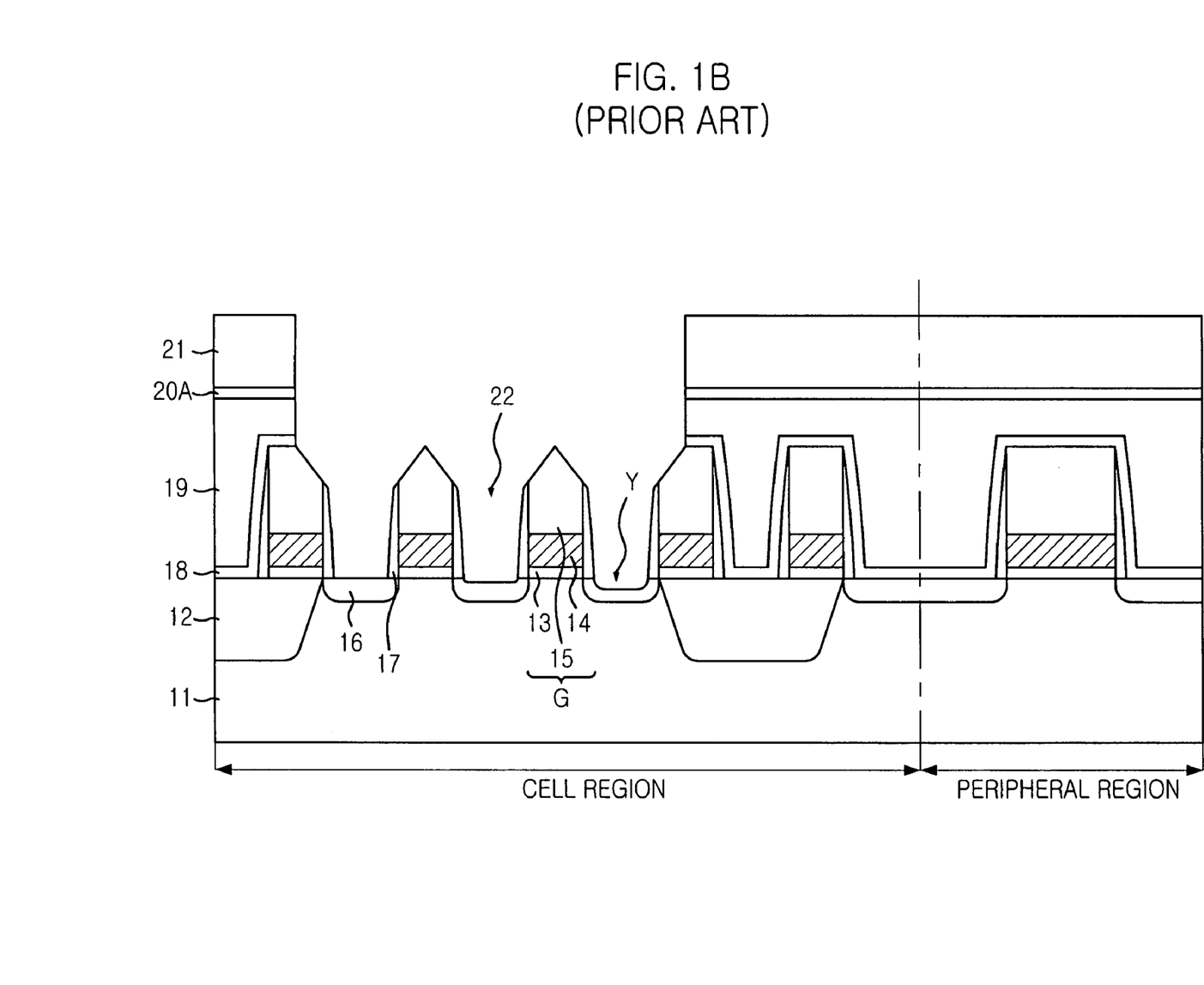
FIG. 1B is a cross-sectional view showing conventional contact holes formed in the substrate structure by performing a self-aligned contact (SAC) etching process.

Referring to FIG. 1B, the nitride layer 20 shown in FIG. 1A is patterned by using the mask 21 as an etch mask, thereby obtaining a hard mask 20A. Then, a SAC etching process proceeds by etching the planarized inter-layer insulation layer 19 with use of the mask 21 and the hard mask 20A as an etch mask. From this SAC etching process, a plurality of contact holes 22 for forming LPCs are formed. At this time of the SAC etching process, the planarized inter-layer insulation layer 19 is etched until the SAC etching process stops at the etch stop layer 18, which is, in turn, etched away, thereby exposing portions of the substrate 11.

Figure 1C:
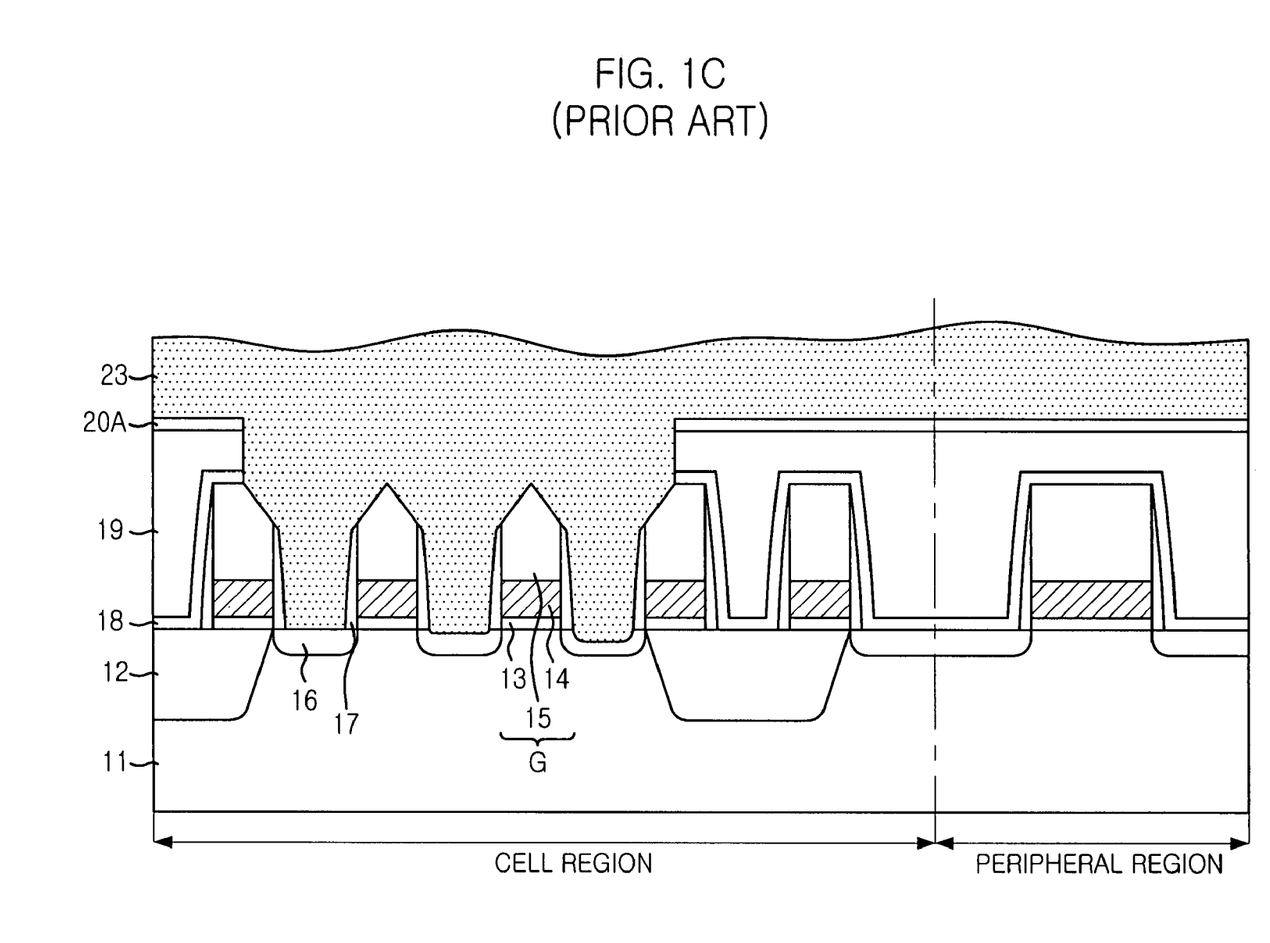
FIG. 1C is a cross-sectional view showing a conventional conductive material filled into the contact holes.

Referring to FIG. 1C, the mask 21 is removed, and then, a polysilicon layer 23 is formed until being sufficiently filled into the contact holes 22.

Figure 1D:
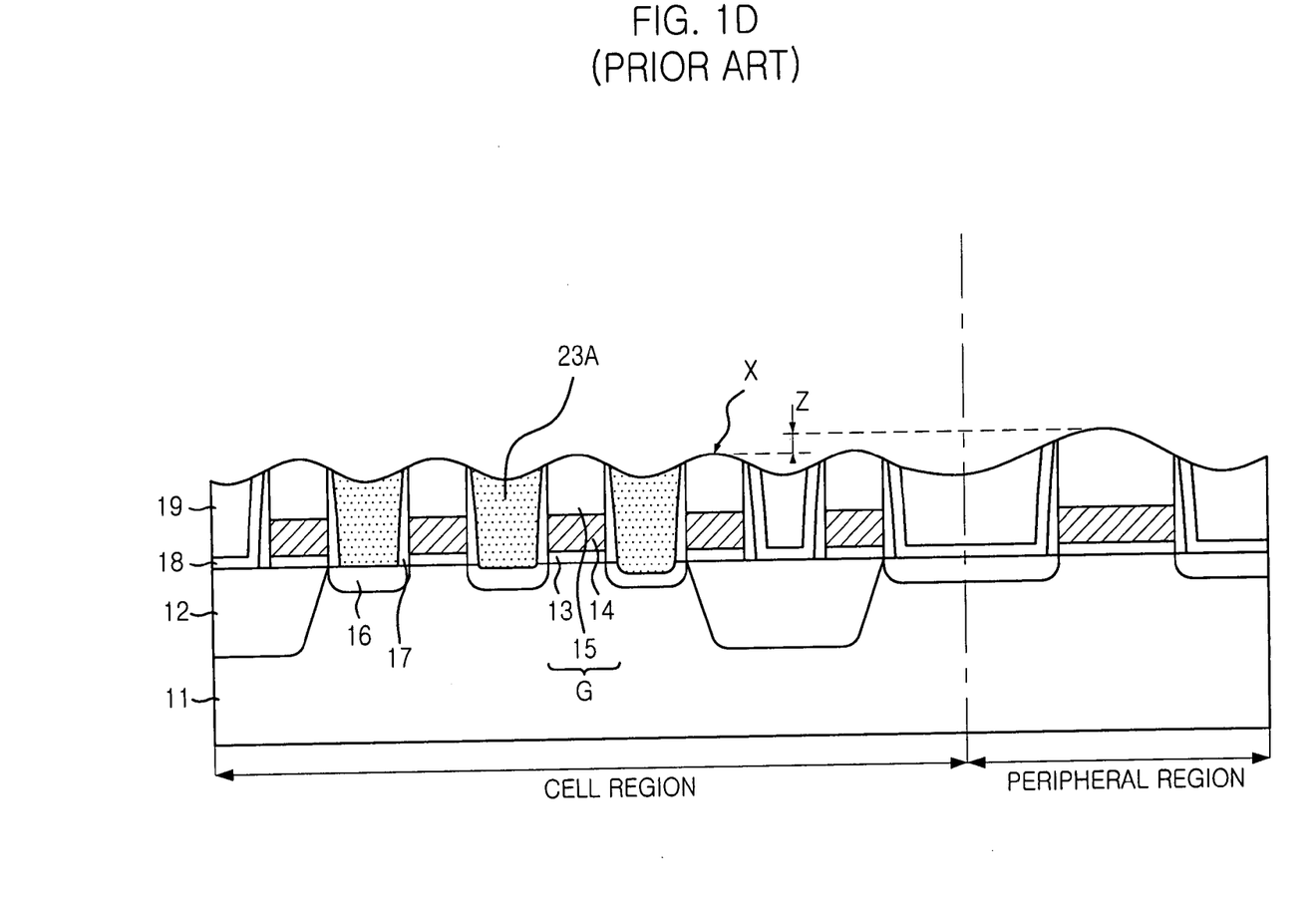
FIG. 1D is a cross-sectional view showing conventional landing plug contacts (LPCs)

Referring to FIG. 1D, the polysilicon layer 23 shown in FIG. 1C is subjected to a second CMP process which continues until a surface of the gate hard mask 15 is exposed, so that a plurality of LPCs 23A buried with polysilicon are formed. Herein, such LPCs are referred to as the landing plug polysilicon (LPP) contacts.

However, a current demand in micronization of semiconductor devices has led to a gradual decrease in margins for the above described mask formation process and for the above SAC etching process. That is, the inter-layer insulation layer 19 may not be sufficiently planarized by the first CMP process, or a difference in heights of the inter-layer insulation layer 19 remaining after the first CMP process becomes severe in overall regions because of the non-uniformly planarized inter-layer insulation layer 19 by the first CMP process. The severe height difference between the remaining portions of the inter-layer insulation layer 19 may have negative impacts on the above mask formation process and the SAC etching process.

More specific to the possible negative impacts on the SAC etching process, if the remaining portions of the inter-layer 19 are thin, the gate hard mask 15 is severely damaged, thereby making a thickness of the gate hard mask 15 remaining after the second CMP process decreased. This decreased thickness of the remaining gate hard mask 15 is denoted as 'X' in FIG. 1D. Also, this decreased thickness of the remaining gate hard mask 15 makes the remaining gate hard mask 15 more susceptibly damaged by a process for forming bit line contacts or storage node contacts, thereby inducing a failure in the SAC etching process. If the remaining portions of the inter-layer insulation layer 19 are thick, there is a problem that the contact holes 22 are not opened in the course of forming the contact holes 22 for forming the LPP contacts 23A.

During the SAC etching process for forming the contact holes 22, the predetermined portions of the substrate 11 exposed by the removal of the etch stop layer 18 are damaged as denoted with 'Y' in FIG. 1B. However, there is a difference in thicknesses of the damaged portions of the exposed substrate 11 in overall regions, thereby resulting in a difficulty in realizing uniformity of device characteristics.

The above explained problems are caused by the non-uniformity in the planarization by the first CMP process, and thus, it is difficult to solve these problems by employing such a CMP process for planarizing an inter-layer insulation layer with use of conventional slurry for use in an oxide layer.

Also, the nitride layer 20 for forming a hard mask is formed to secure a margin for pattering the target layers during the SAC etching process. However, this nitride layer 20 may negatively affects the succeeding second CMP process. That is, the nitride layer 20 remaining after the formation of the contact holes 22, i.e., the hard mask 20A, in a peripheral region plays a role in stopping the second CMP process using slurry for use in an oxide layer having a different etch selectivity from nitride. Thus, the LPP contacts 23A in a cell region may not be completely polished by the second CMP process. As a result of this problem, an overall polishing time for removing the hard mask 20A in the peripheral region may be elongated, further degrading uniformity of a wafer. This non-uniformity is denoted as 'Z' in FIG. 1D.

SUMMARY OF THE INVENTION

It is, therefore, an object of the present invention to provide a method for forming landing plug contacts in a semiconductor device capable of preventing a defect in uniformity of a wafer caused by non-uniformity of a chemical mechanical polishing process applied to an inter-layer insulation layer.

In accordance with an aspect of the present invention, there is provided a method for forming landing plug contacts in a semiconductor device, including the steps of: forming a plurality of gate structures on a substrate, each gate structure including a gate hard mask; forming an inter-layer insulation layer on the gate structures; planarizing the inter-layer insulation layer through a chemical mechanical polishing (CMP) process until the gate hard mask is exposed; forming a hard mask material on the planarized inter-layer insulation layer; patterning the hard mask material, thereby forming a hard mask; forming a plurality of contact holes exposing the substrate disposed between the gate structures by etching the planarized inter-layer insulation layer with use of the hard mask as an etch mask; forming a polysilicon layer on the contact holes; and forming the landing plug contacts buried into the contact holes through a planarization process performed to the polysilicon layer until the gate hard mask is exposed.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for forming landing plug contacts (LPCs) in a semiconductor device in accordance with a preferred embodiment of the present invention will be described in detail with reference to the accompanying drawings.

FIGS. 2A to 2F are cross-sectional views for forming LPCs in a semiconductor device in accordance with a preferred embodiment of the present invention.

Figure 2A:
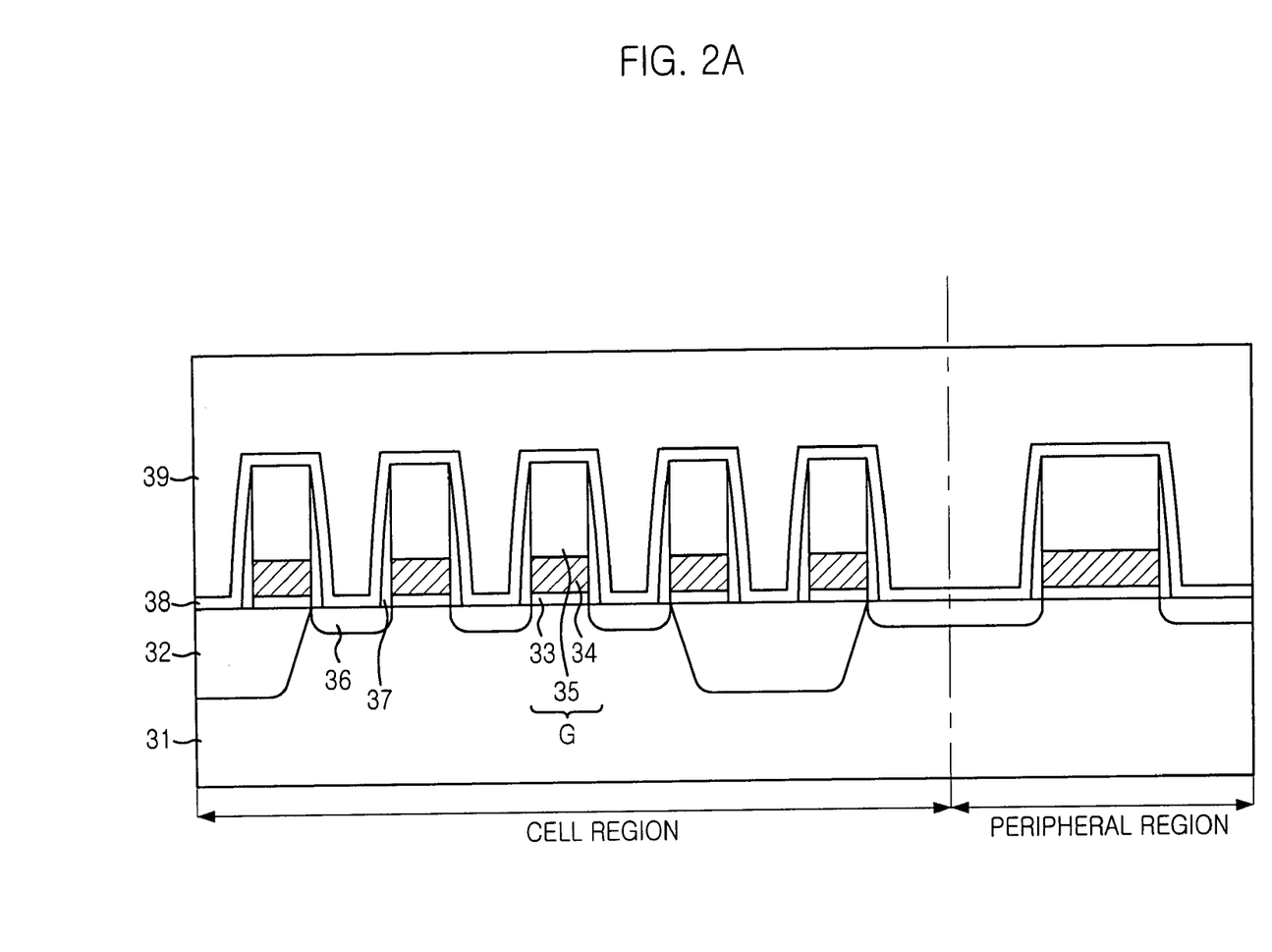
FIG. 2A is a cross-sectional view showing a substrate structure including a plurality of gate structures and an inter-layer insulation layer in accordance with a preferred embodiment of the present invention.

Referring to FIG. 2A, a field oxide layer 32 for isolating device elements is formed in a substrate 31, and then, a plurality of gate structures G are formed on the substrate 31. Herein, each gate structure G includes a gate oxide layer 33, a gate electrode 34 and a gate hard mask 35 made of nitride.

Next, an ion implantation process is performed to portions of the substrate 31 disposed between the gate structures G to form sources/drains 36. Thereafter, a gate spacer 37 is formed on each sidewall of the gate structures G.

Then, an etch stop layer 38 made of a nitride-based material is formed on the gate structures G. An inter-layer insulation layer 39 is formed on the etch stop layer 38 until being sufficiently filled into gaps formed between the gate structures G. Herein, the etch stop layer 38 plays a role in stopping an etching process for forming LPCs.

Figure 2B:
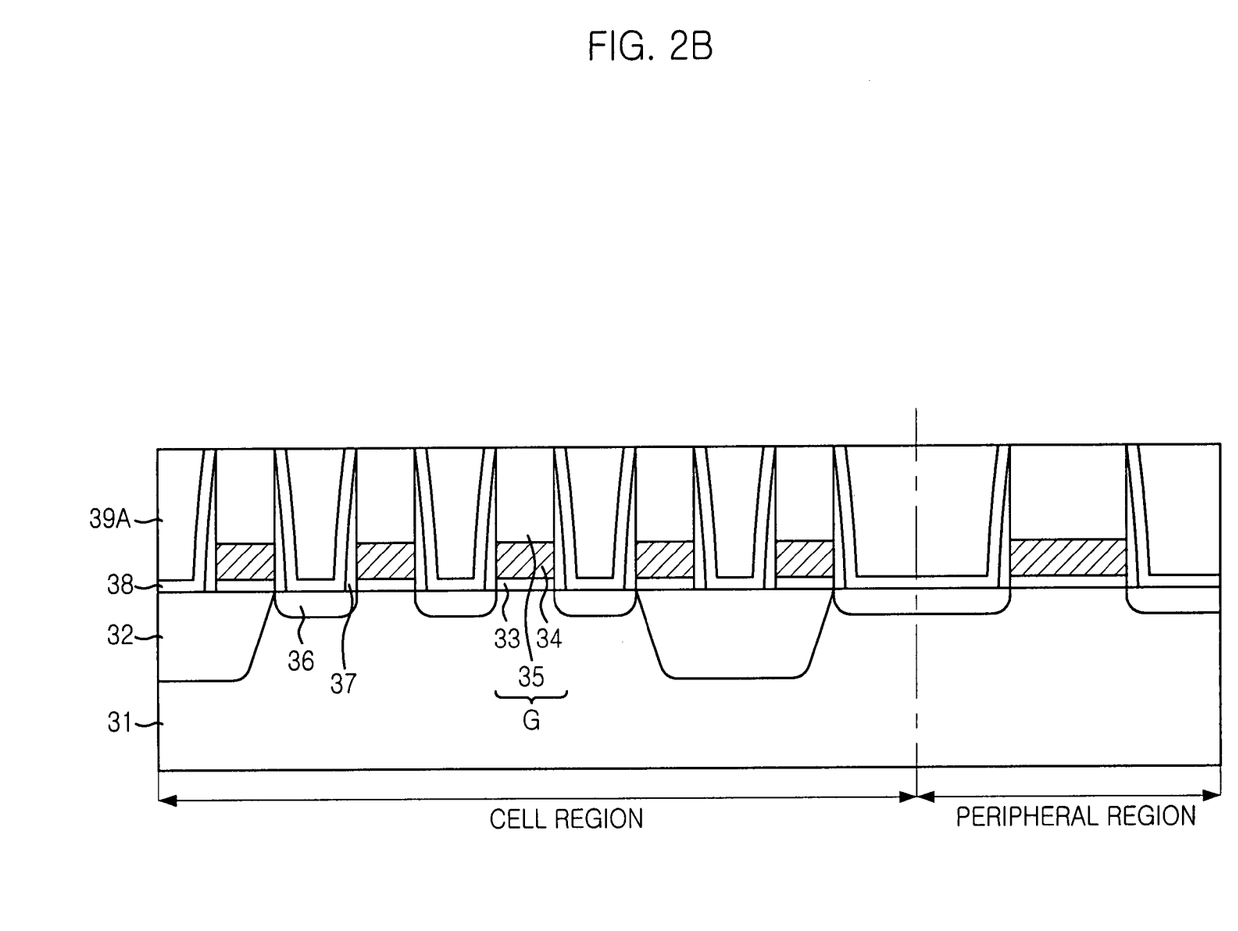
FIG. 2B is a cross-sectional view showing a planarized inter-layer insulation layer through performing a chemical mechanical polishing process in accordance with the preferred embodiment of the present invention.

Referring to FIG. 2B, a first chemical mechanical polishing (CMP) process is performed to the inter-layer insulation layer 39 shown in FIG. 2A by using the gate hard mask 35 as a stopping layer for the CMP process. The first CMP process continues until a surface of the gate hard mask 35 is exposed.

Particularly, the first CMP process employs a high selectivity slurry (HSS) having a high selectivity with respect to the gate hard mask 35. At this time, the HSS has a selectivity ratio of the gate hard mask 35 to the above inter-layer insulation layer 39 in a value of approximately 1 to a value ranging between approximately 10 to approximately 200. Herein, the gate hard mask 35 is made of nitride, while the inter-layer insulation layer 39 is made of an oxide-based material. Also, examples of a polishing agent contained within the HSS are $SiO_2$, $CeO_2$, $Al_2O_3$ or $ZrO_3$ produced through a fumed method or a colloidal method.

In general, slurry includes components of a polishing agent, highly purified water, a pH stabilizer, and an interface activator. Among these components, the polishing agent mechanically polishes a surface of a target layer after being applied with a pressure provided from a polishing equipment. Also, the pH stabilizer serves a role in optimizing a dispersion state of the polishing agent with use of electrical repulsion by controlling a pH of a solution. Examples of the interface activator are a dispersion agent, which maximally suppresses slurry from becoming a gel and particles from being precipitated, and a buffering solution for blocking slurry from being affected by dispersiveness of particles generated by changes in a pH. At this time, the pH stabilizer and the interface activator are based on alkalis, for instance, a solution of KOH.

Herein, the HSS allows the CMP process to be carried out selectively only to an oxide layer but not to a nitride layer. Thus, the first CMP process proceeds for a sufficient time, thereby providing a planarized inter-layer insulation layer 39A made of an oxide-based material, but stops at the gate hard mask 35 made of nitride.

After the first CMP process, the planarized inter-layer insulation layer 39A does not remain on top of the gate structures G but remains only between the gate structures G. That is, a thickness of the inter-layer insulation layer 39 shown in FIG. 2A does not need to be controlled in order to make the inter-layer insulation layer 39 remain with a predetermined thickness on top of the gate structures G. As a result of this effect, it is possible to make the planarized inter-layer insulation layer 39A uniformly remain.

Figure 2C:
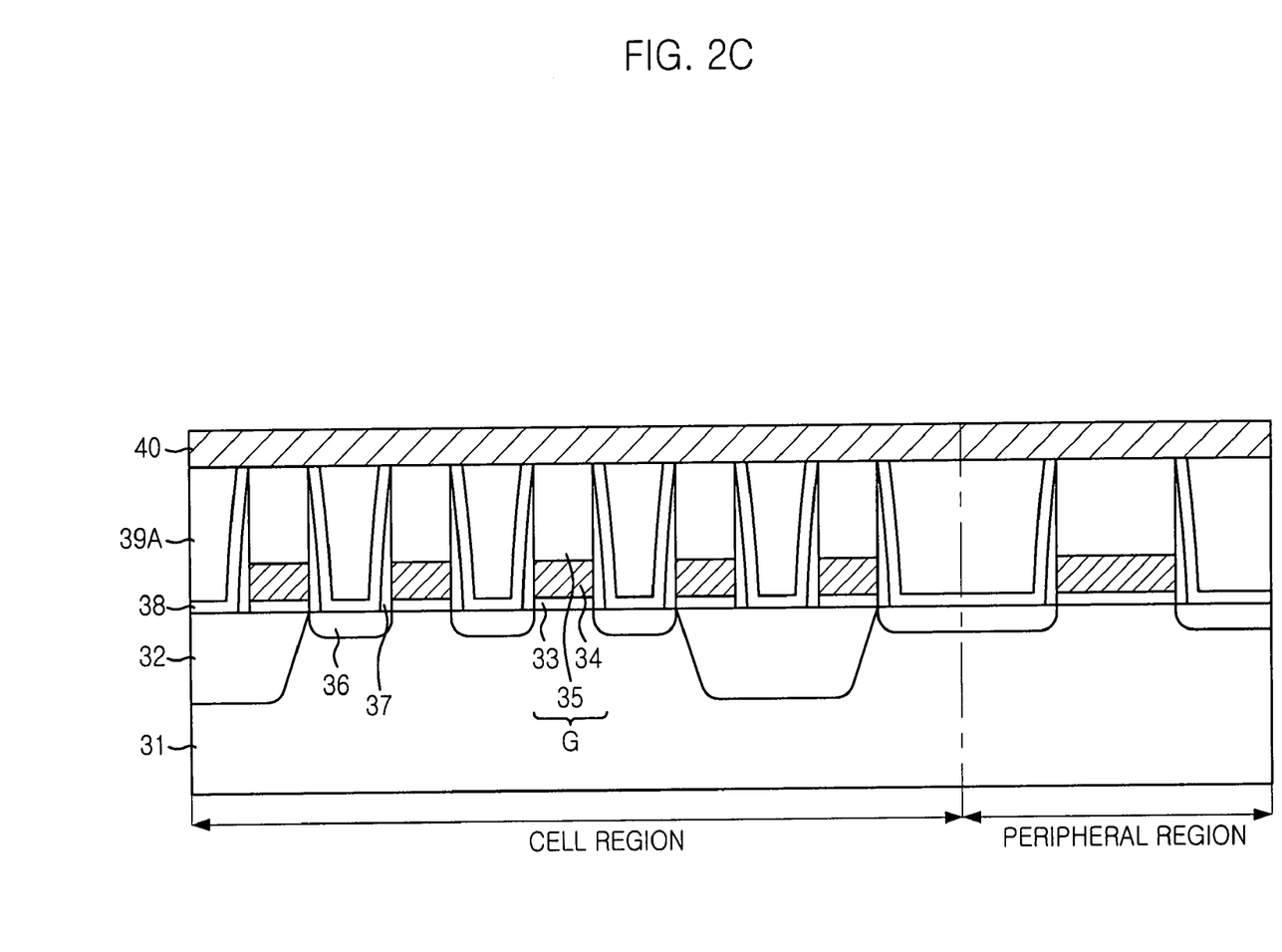
FIG. 2C is a cross-sectional view showing a hard mask material formed on the planarized inter-layer insulation layer in accordance with the preferred embodiment of the present invention.

Referring to FIG. 2C, a first polysilicon layer 40 is formed on the exposed surface of the gate hard mask 35 and the planarized inter-layer insulation layer 39A. Herein, the first polysilicon layer 40 is used for forming a hard mask for use in an etching process for forming LPCs and has a thickness ranging from approximately 300 Å to approximately 5,000 Å. It is also possible to use nitride as a hard mask material in addition to the use of polysilicon.

Figure 2D:
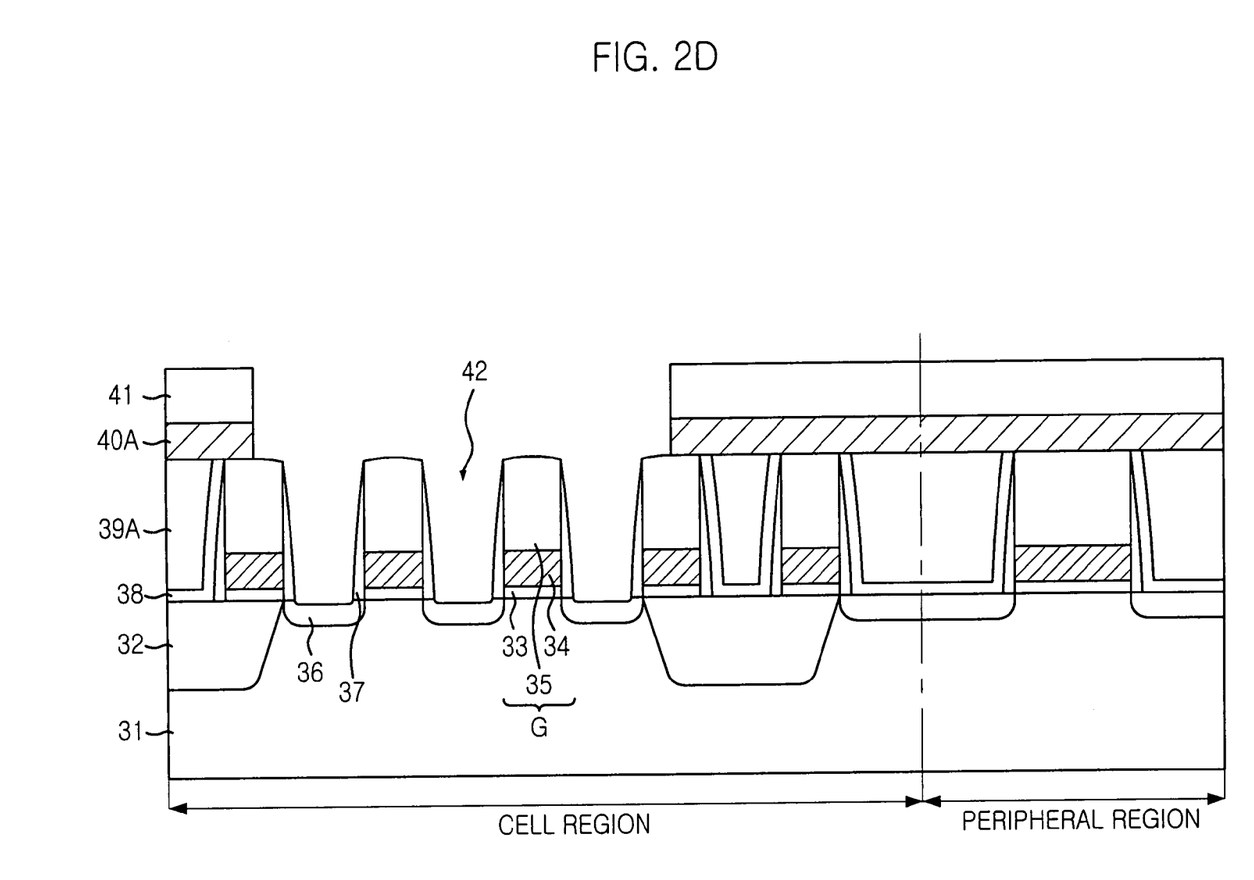
FIG. 2D is a cross-sectional view showing a plurality of contact holes formed by performing a SAC etching process in accordance with the preferred embodiment of the present invention.

Referring to FIG. 2D, a photosensitive layer is formed on the first polysilicon layer 40 and is patterned by performing a photo-exposure and developing process to form a mask 41 for use in the succeeding etching process for forming LPCs. At this time, the mask 41 is a contact mask formed in the shape of 'T' or 'I'.

Also, it is possible to secure a sufficient margin for patterning the mask 41 since the inter-layer insulation layer 39 shown in FIG. 2A is planarized uniformly in overall regions by performing the first CMP process until the gate hard mask 35 is exposed.

Next, the first polysilicon layer 40 is patterned by using the mask 41 as an etch mask, thereby obtaining a hard mask 40A for use in LPCs. Then, a self-aligned contact (SAC) etching process for forming a plurality of contact holes 42 for forming LPCs proceeds by etching the planarized inter-layer insulation layer 39A with use of the mask 41 and the hard mask 40A as an etch mask. At this time, the planarized inter-layer insulation layer 39A is etched until the SAC etching process stops at the etch stop layer 38, which is subsequently etched to thereby expose predetermined portions of the substrate 31.

During the SAC etching process, the loss of the gate hard mask 35 is minimized since only the planarized inter-layer insulation layer 39A disposed between the gate structures G is etched. Also, the uniform thickness of the planarized inter-layer insulation layer 39A makes it possible to control a thickness of the substrate 31 that is lost during the SAC etching process to be uniform in overall regions.

Figure 2E:
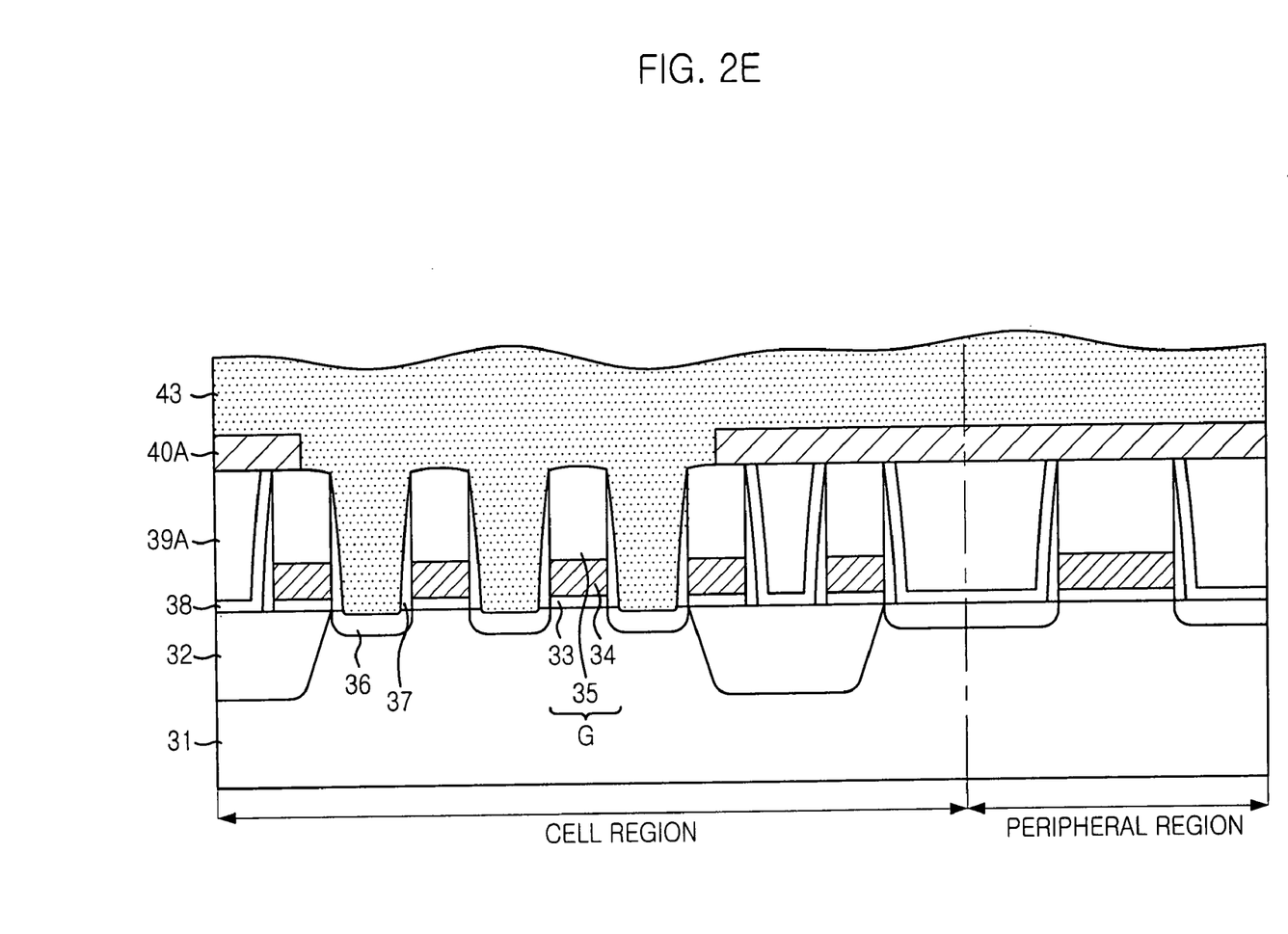
FIG. 2E is a cross-sectional view showing a conductive material filled into the plurality of contact holes in accordance with the preferred embodiment of the present invention.

Referring to FIG. 2E, a second polysilicon layer 43 is formed on the above resulting substrate structure until being sufficiently filled into the contact holes 42.

Figure 2F:
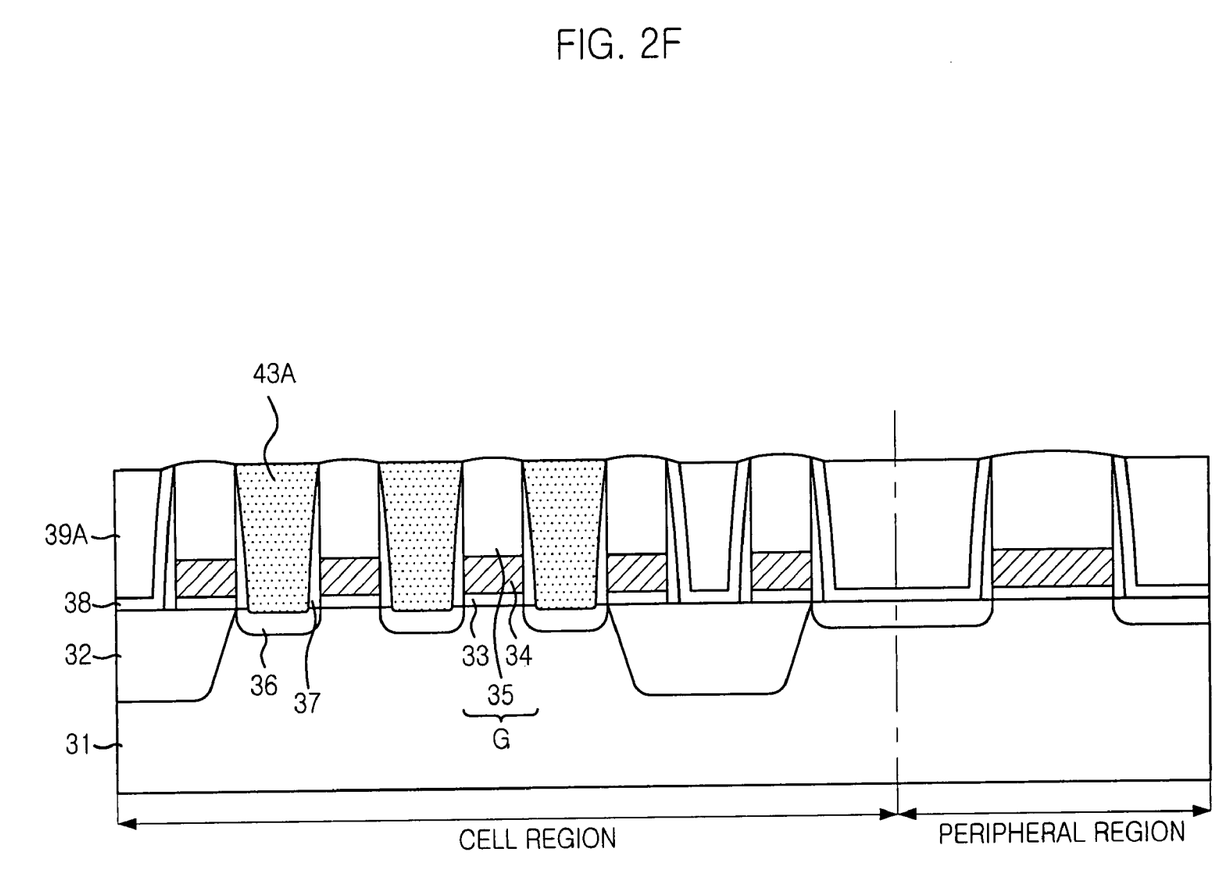
FIG. 2F is a cross-sectional view showing a plurality of LPCs in accordance with the preferred embodiment of the present invention.

Referring to FIG. 2F, the second polysilicon layer 43 is subjected to a second CMP process until a surface of the gate hard mask 35 is exposed, so that a plurality of LPCs 43A made of polysilicon are formed. Herein, the LPCs made of polysilicon are referred to as the landing plug polysilicon (LPP) contacts. In addition to the application of the second CMP process, it is still possible to apply an etch-back process.

Herein, the second CMP process chemically and mechanically polishes the second polysilicon layer 43 and the hard mask shown in FIG. 2E with use of a typical type of slurry for use in oxide. Also, a polishing time is not elongated since the second CMP process chemically and mechanically polishes the hard mask 40A having a similar polishing selectivity with an oxide layer. This decrease in the polishing time results in a sufficiently secured thickness of the gate hard mask 35 along with the minimum loss of the gate hard mask 35. Furthermore, this sufficiently secured thickness of the gate hard mask 35 provides a further effect of reducing incidences of failure in a SAC etching process for forming subsequent bit line contacts and storage node contacts.

In accordance with the preferred embodiment of the present invention, the use of HSS in the first CMP process makes it possible to obtain a uniform thickness of the remaining inter-layer insulation layer after the first CMP process which continues until the gate hard mask is exposed. As a result, it is possible to secure a process margin for forming the mask for use in a LPC formation process and simultaneously to minimize the loss of the gate hard mask during the SAC etching process.

In addition, it is possible to secure the uniformly polished thickness of the target layers after the second CMP process by polishing the first polysilicon layer having a similar polishing selectivity with an oxide layer. Simultaneously, there is an effect of securing a thickness of the gate hard mask. As a result of these effects, it is possible to reduce incidences of failure in the SAC etching process for forming subsequent bit lines and storage node contacts, thereby eventually leading to enhancement in yields of semiconductor devices.

The present application contains subject matter related to the Korean patent application No. KR 2003-0098536, filed in the Korean Patent Office on Dec. 29, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming landing plug contacts in a semiconductor device, comprising the steps of:
    forming a plurality of gate structures on a substrate, each gate structure including a gate hard mask;
    forming an inter-layer insulation layer on the gate structures;
    planarizing the inter-layer insulation layer and the gate structures for obtaining a uniformly planarized surface of overall regions through a chemical mechanical polishing (CMP) process employing a high selectivity slurry (HSS) until the gate hard mask is exposed;
    forming a hard mask material on the uniformly planarized surface;
    forming a hard mask;
    forming a plurality of contact holes exposing the substrate disposed between the gate structures by etching the planarized inter-layer insulation layer using the gate hard mask and the hard mask as an etch mask;
    forming a polysilicon layer in the contact holes; and
    forming landing plug contacts in the contact holes through a planarization process performed to the polysilicon layer until the gate hard mask is exposed.

2. The method of claim 1, wherein each of the gate structures further includes a gate oxide layer and a gate conductive layer.

3. the method of claim 1, wherein the gate hard mask is made of a nitride-based material.

4. The method of claim 1, wherein the has a high selectivity to the gate hard mask.

5. The method of claim 4, wherein the HSS has a polishing selectivity ratio of the gate hard mask to the inter-layer insulation layer in a value of approximately 1 to a value ranging from approximately 10 to approximately 200.

6. The method of claim 5, wherein the HSS has a pH value ranging from approximately 2 to approximately 12.

7. The method of claim 5, wherein the HSS includes a polishing agent selected from a group consisting of $SiO_2$, $CeO_2$, $Al_2O_3$ and $ZrO_3$.

8. The method of claim 7, wherein the polishing agent is formed through a fumed method.

9. The method of claim 7, wherein the polishing agent is formed through a colloidal method.

10. The method of claim 1, wherein the hard mask material is formed with a thickness ranging from approximately 300 Å to approximately 5,000 Å.

11. The method of claim 1, wherein the planarization process is a chemical mechanical polishing process.

12. The method of claim 1, wherein the hard mask material is polysilicon.

* * * * *